United States Patent
Lu et al.

(10) Patent No.: US 9,206,830 B2
(45) Date of Patent: Dec. 8, 2015

(54) FLEXIBLE POSITIONING POST

(71) Applicant: Wistron Corporation, New Taipei (TW)

(72) Inventors: Kuo-Cheng Lu, New Taipei (TW); Wen-Cheng Chang, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 0 days.

(21) Appl. No.: 14/178,678

(22) Filed: Feb. 12, 2014

(65) Prior Publication Data

US 2015/0139755 A1    May 21, 2015

(30) Foreign Application Priority Data

Nov. 20, 2013 (TW) .............................. 102221729 U

(51) Int. Cl.
*F16B 19/00* (2006.01)

(52) U.S. Cl.
CPC .................... *F16B 19/004* (2013.01)

(58) Field of Classification Search
CPC .......................................... F16B 19/04
USPC ..................... 411/510, 520–523; 24/293, 295
See application file for complete search history.

(56) References Cited

U.S. PATENT DOCUMENTS

| | | | |
|---|---|---|---|
| 4,678,385 A * | 7/1987 | Ollivier et al. ................. | 411/456 |
| 5,857,244 A * | 1/1999 | Edwards et al. ................. | 24/297 |
| 6,499,782 B2 * | 12/2002 | Kwon .......................... | 296/1.02 |
| 7,896,601 B2 * | 3/2011 | Kalyanadurga et al. ...... | 411/510 |
| 2007/0251176 A1 * | 11/2007 | Johnson et al. .............. | 52/489.2 |
| 2008/0134472 A1 * | 6/2008 | Kosidlo et al. ................. | 24/293 |

* cited by examiner

*Primary Examiner* — Gary Estremsky
(74) *Attorney, Agent, or Firm* — Rabin & Berdo, PC

(57) ABSTRACT

A flexible positioning post includes a base, a metal post and a plurality of metal elastic pieces. The base has an upper surface. The metal post has a first end and a second end opposite to each other, and the first end is connected to the upper surface of the base. Each of the metal elastic pieces has a fixed end and a free end opposite to each other. The fixed end is securely assembled at the second end of the metal post, and the free end is adjacent to the upper surface of the base and bent toward the metal post to form a bending portion. Consequently, upon receiving a foreign force, the free end of each of the metal elastic pieces is moved toward the metal post; conversely, once the foreign force is removed, the free end of each of the metal elastic pieces is moved resiliently.

10 Claims, 8 Drawing Sheets

FLEXIBLE POSITIONING POST

CROSS-REFERENCES TO RELATED APPLICATIONS

This non-provisional application claims priority under 35 U.S.C. §119(a) on Patent Application No. 102221729 filed in Taiwan, R.O.C. on 2013 Nov. 20, the entire contents of which are hereby incorporated by reference.

BACKGROUND

1. Technical Field

The disclosure relates to a flexible positioning post, and particularly to a flexible positioning post capable of being rapidly positioned and detached with a circuit board.

2. Related Art

The circuit boards must be positioned in the housing of the electronic devices. During the research and development procedures of the electronic devices, the circuit boards must also be positioned for testing. Conventionally, the circuit boards are fastened in the housing or the testing stage via the plastic locking members; for example, the plastic bolts are embedded into the housing, and the plastic nuts are applied to thread with the plastic bolts for positioning the circuit board; or the plastic nuts are embedded into the housing, and the plastic bolts are applied to thread with the plastic nuts for positioning the circuit board. However, a problem of "stripped thread" could result from the nuts and bolts being attached with and detached from each other repeatedly when the electronic devices are under maintenance or in a test, resulting in bad locking performance. Furthermore, in the case of the plastic nuts being embedded into the housing, once the function of the threaded holes of the nuts fails, the entire housing must be replaced, thereby leading an inconvenience of the maintenance of the electronic devices.

Additionally, the grounding of the circuit board is achieved by externally directing out a wire from the circuit board and collecting the wire to a grounding circuit. However, for such grounding method, the grounding wire and the connector for connecting to the grounding wire must be assembled on the circuit board, thereby leading a small grounding area for the circuit board; in addition, such grounding is too complex and inconvenient.

SUMMARY

In view of this, a flexible positioning post is provided and includes a base, a metal post and a plurality of metal elastic pieces. The base has an upper surface. The metal post has a first end and a second end opposite to each other, and the first end is connected to the upper surface of the base. Each of the metal elastic pieces has a fixed end and a free end opposite to each other. The fixed end is securely assembled at the second end of the metal post, and the free end is adjacent to the upper surface of the base and bent toward the metal post to form a bending portion. Consequently, upon receiving a foreign force, the free end of each of the metal elastic pieces is moved toward the metal post; conversely, once the foreign force is removed, the free end of each of the metal elastic pieces is moved resiliently.

Based on the structure mentioned above, the base of the flexible positioning post can be embedded into the housing or the testing stage, and the metal post and the metal elastic pieces disposed on the base can be the fastening structure for fastening the circuit board. When the circuit board is tended to be engaged with the flexible positioning post, the user only needs to open assembling holes on the circuit board, and press the circuit board into the flexible positioning post downwardly. Since the metal elastic piece is moved toward the metal post upon receiving the foreign force, the metal elastic piece passes through the circuit board. After the metal elastic piece passes through the circuit board, the force applied to the metal elastic piece is removed, thereby the metal elastic piece is moved resiliently; at this time, the metal elastic piece is abutted against the circuit board, so that the circuit board is fastened.

When the circuit board needs to be detached from the flexible positioning post, the metal elastic piece is forced so that the metal elastic pieces is moved toward the metal post, thereby the metal elastic piece freely passing through the assembling hole of the circuit board for detaching the circuit board from the flexible positioning post. Based on this, the user does not need any extra tools for assembling or disassembling the circuit board, so the assembling and the repairing of the circuit board become more convenient. In addition, within the present invention, since no components with threaded structures, like nuts and bolts are applied, the stripped thread problem does not occur after repeatedly assembling/disassembling.

Additionally, since the entire flexible positioning post is made of metal, the flexible positioning post is provided as a connection point for grounding. When the circuit board is engaged with the flexible positioning post, the metal elastic piece is abutted against the circuit board; in this condition, the grounding circuit of the circuit board can be directed to the metal elastic piece with the flexible positioning post being the connector, so that the circuit board is grounding to the housing. Alternatively, a number of flexible positioning posts are electrically connected with each other on the housing via the copper foil next directed to the grounding wire, so that many circuit boards can be connected to the grounding wire without additional connector.

Further, for expanding the grounding area, copper foil with large area is disposed on the housing and connected to the flexible positioning post, so that the whole copper foil is applied as the grounding face to significantly increase the grounding area of the circuit board.

The detailed features and advantages of the disclosure are described below in great detail through the following embodiments, the content of the detailed description is sufficient for those skilled in the art to understand the technical content of the disclosure and to implement the disclosure there accordingly. Based upon the content of the specification, the claims, and the drawings, those skilled in the art can easily understand the relevant objectives and advantages of the disclosure.

BRIEF DESCRIPTION OF THE DRAWINGS

The disclosure will become more fully understood from the detailed description given herein below for illustration only and thus not limitative of the disclosure, wherein.

DETAILED DESCRIPTION

Figure 1:
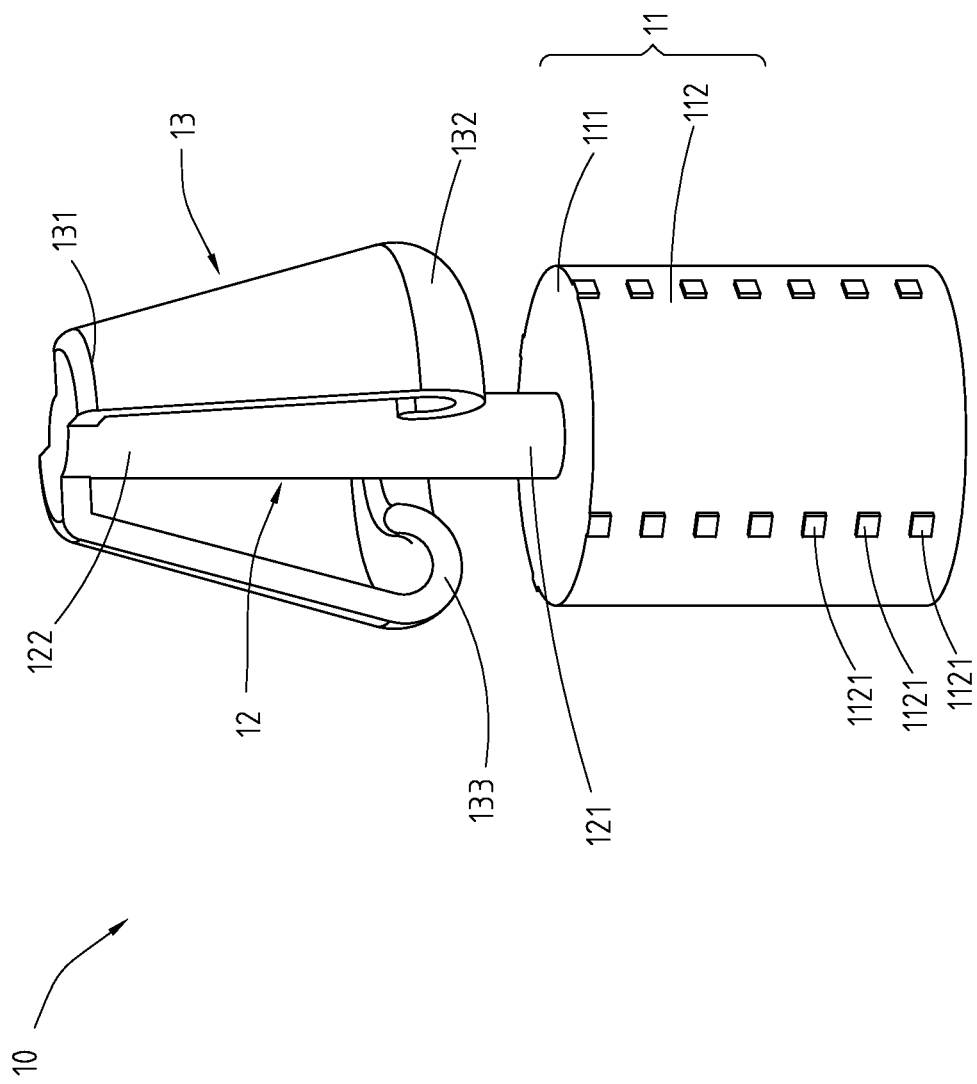
FIG. 1 is a perspective view of a flexible positioning post of a first embodiment of the disclosure.
Figure 2:
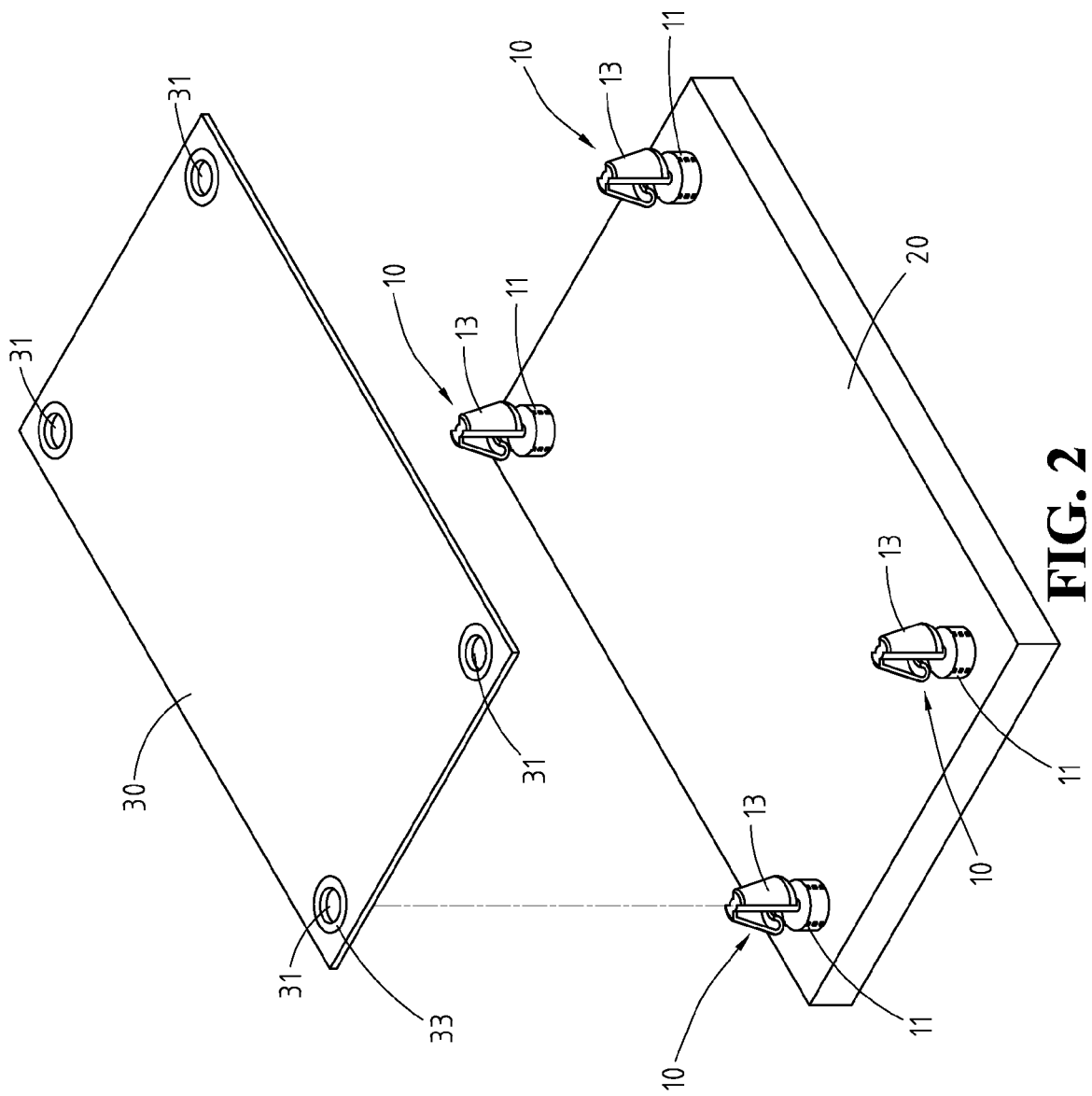
FIG. 2 is a schematic view for showing the flexible positioning post of the first embodiment is assembled on a housing.

Please refer to FIG. 1 and FIG. 2, which are a perspective view of a flexible positioning post of a first embodiment and a schematic view for showing the flexible positioning post of the first embodiment is assembled on a housing. The flexible positioning post 10 includes a base 11, a metal post 12, and two metal elastic pieces 13. The base 11 has an upper surface 111 and a lateral surface 112. As shown in FIG. 1, the base 11 is round cylinder shaped in this embodiment, but embodiments of the disclosure are not limited thereto, in some implementation aspects, the base 11 is polygonal cylinder shaped. The upper surface 111 is the top face of the round cylindered base 11, and the lateral surface 112 is the surface of the body of the cylinder connected to the upper surface 111.

The lateral surface 112 has a plurality of protruding blocks 1121 disposed thereon. In this embodiment, the protruding blocks 1121 are disposed uniformly around the axis center of the lateral surface 112 of the base 11; in this case, a number of protruding blocks 1121 are disposed linearly and downwardly from the upper surface 111 of the base 11, but embodiments of the disclosure are not limited thereto; in some implementation aspects, a number of protruding blocks 1121 are disposed irregularly or in an interlaced manner on the lateral surface 112. Please refer to FIG. 1 and FIG. 2, in which for embedding the base 11 into the housing 20 made of plastic, hot melting or ultrasonic welding methods are commonly applied. Here, the protruding blocks 1121 are provided as the skidproof structure of the housing 20, such that the flexible positioning post 10 does not detach from the housing 20 because of the force applied thereto upon assembling or disassembling.

Please refer to FIG. 1 again; the metal post 12 has a first end 121 and a second end 122 opposite to each other. The first end 121 is connected to the upper surface 111 of the base 11, and the two metal elastic pieces 13 are securely assembled on the second end 122. In this embodiment, the metal post 12 is a round post; but embodiments of the disclosure are not limited thereto, the metal post 12 can be a polygonal post in some embodiments. For the convenience of positioning during manufacturing and assembling, the metal post 12 is disposed at the axis center of the base 11. In some embodiments, the base 11 and the metal post 12 are formed integrally as a whole by, for example, molding or cutting molding, so that the base 11 and the metal post 12 are formed as an inseparable structure.

As shown in FIG. 1, the two metal elastic pieces 13 are disposed uniformly around an outer periphery of the metal post 12. In this embodiment, the two metal elastic pieces 13 are disposed opposite to each other; in the case of three metal elastic pieces 13, the outline of the three metal elastic pieces 13 is formed as a regular triangle, that is, the three metal elastic pieces 13 are disposed uniformly around the metal post 12 and spaced 120 degrees apart. Likewise, the number of the metal elastic pieces 13 can be four, five or more. Each of the metal elastic pieces 13 has a fixed end 131 and a free end 132 opposite to each other. The fixed end 131 is securely assembled at the second end 122 of the metal post 12. The free end 132 is adjacent to the upper surface 111 of the base 11 and bent toward the metal post 12 such that forming a bending portion 133. Accordingly, because of the material properties of the metal elastic pieces 13 and the bending portion 133 formed on the free end 132, upon receiving a foreign force, the free end 132 of each of the metal elastic pieces 13 is moved toward the metal post 12; conversely, once the foreign force is removed, the free end 132 of each of the metal elastic pieces 13 is moved resiliently.

For the purpose of enhancing the resilient elasticity, the width of the free end 132 of each of the metal elastic pieces 13 is longer than the width of the fixed end 131 thereof. In a lateral view, the outline of the elastic metal piece 13 is formed as a trapezoid. Based on this, the bending portion 133 of the free end 132 is longer than the rest portion thereof and provides a stronger resilient elasticity.

Figure 3:
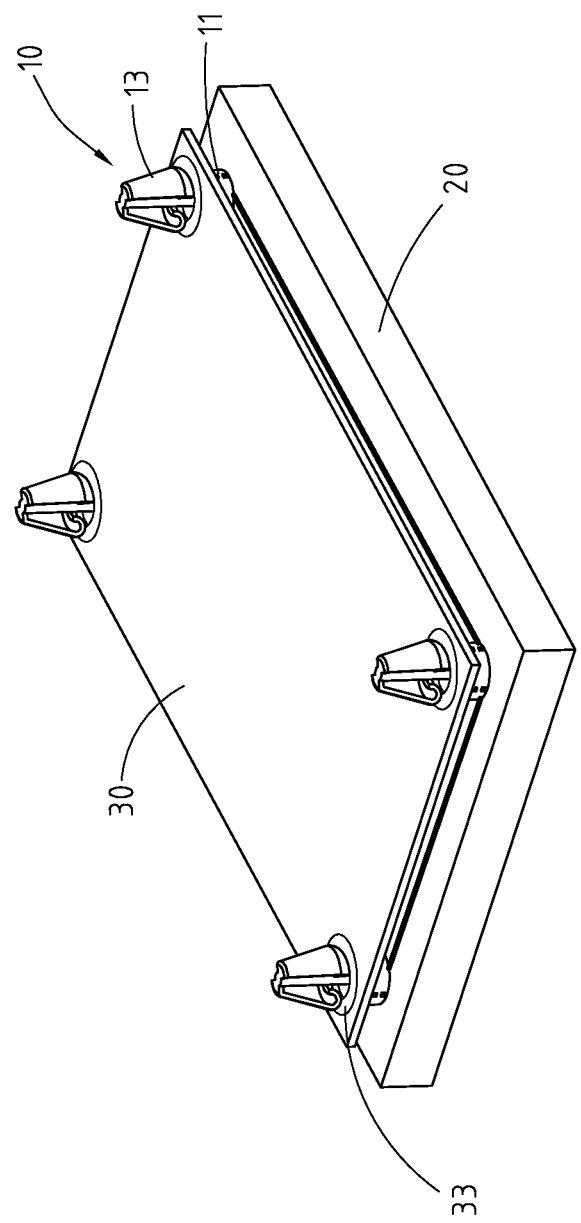
FIG. 3 is a schematic view for showing a circuit board is assembled on the flexible positioning post of the first embodiment.

Please refer to FIG. 2 and FIG. 3; FIG. 3 is a schematic view for showing a circuit board is assembled on the flexible positioning post of the first embodiment. In this embodiment, for correspondingly matching with four assembling holes 31 of a circuit board 30, four flexible positioning posts 10 are assembled on the housing 20; but embodiments of the disclosure are not limited thereto, the number of the flexible positioning posts 10 is adjustable according to the size of the circuit board 30. As shown in FIG. 2, after the four flexible positioning posts 10 are securely assembled on the housing 20, each assembling hole 31 of the circuit board 30 is aimed to each corresponding flexible positioning post 10, next the circuit board 30 is pressed downwardly, so that the circuit board 30 is engaged with the flexible positioning posts 10.

In other words, after each of the assembling holes 31 is aimed to each corresponding of the flexible positioning posts 10, by pressing the circuit board 30 downwardly, each of the assembling holes 31 will apply force to the two metal elastic pieces 13 of each corresponding of the flexible positioning posts 10; after the two metal elastic pieces 13 receive the force, the free ends 132 of the two metal elastic pieces 13 are moved toward the metal post 12 because of the force applied from the assembling holes 31, so that the two metal elastic pieces 13 pass through the assembling hole 31 of the circuit board 30. After the circuit board 30 abuts against the upper surface 111 of the base 11, since the two metal elastic pieces 13 have passed through the assembling hole 31 of the circuit board 30, the force applied to the two metal elastic pieces 13 is removed thereby the two metal elastic pieces 13 moving resiliently; at the same time, the bottoms of the bending portions 133 formed on the free ends 132 of the two metal elastic pieces 13 are abutted against the circuit board 30, so that the circuit board 30 is fastened between the upper surface 111 of the base 11 and the bending portions 133 of the two metal elastic pieces 13.

After the circuit board 30 has been engaged with the flexible positioning post 10, in order to be fastened and abutted against the metal elastic pieces 13 of the flexible positioning posts 10 rather than to be detached from the flexible positioning post 10, the area of the assembling hole 31 is smaller than the area formed by enclosing the free ends 132 of the two metal elastic pieces 13. Based on this, after the metal elastic pieces 13 pass through the assembling hole 31 of the circuit board 30, the metal elastic pieces 13 are moved resiliently, so that the bending portion 133 of the free end 132 of the metal elastic piece 13 is abutted against the circuit board 30. Nevertheless, for being passing through the two metal elastic pieces 13 and engaged with the flexible positioning post 10, the area of the assembling hole 31 of the circuit board 30 should be larger than a cross-sectional area defined by the two metal elastic pieces 13 when the two metal elastic pieces 13 are moved toward the metal post 12.

When the circuit board 30 must be replaced or repaired, the circuit board 30 can be simply detached from the flexible positioning posts 10 by forcing to the two metal elastic pieces 13, so that the two metal elastic pieces 13 can pass through the assembling holes 31 of the circuit board 30. Based on this, no extra tools must be applied during assembling or disassembling the circuit board 30. Additionally, after each of the assembling holes 31 are aiming to each corresponding of the flexible positioning posts 10, all of the metal elastic pieces 13 of the flexible positioning posts 10 can pass through the assembling holes 31 of the circuit board 30 by one-time press, so that the assembling holes 31 of the circuit board 30 is engaged with the flexible positioning posts 10. Consequently, the time for assembling the circuit board 30 in the housing 20 can be significantly reduced.

Figure 4:
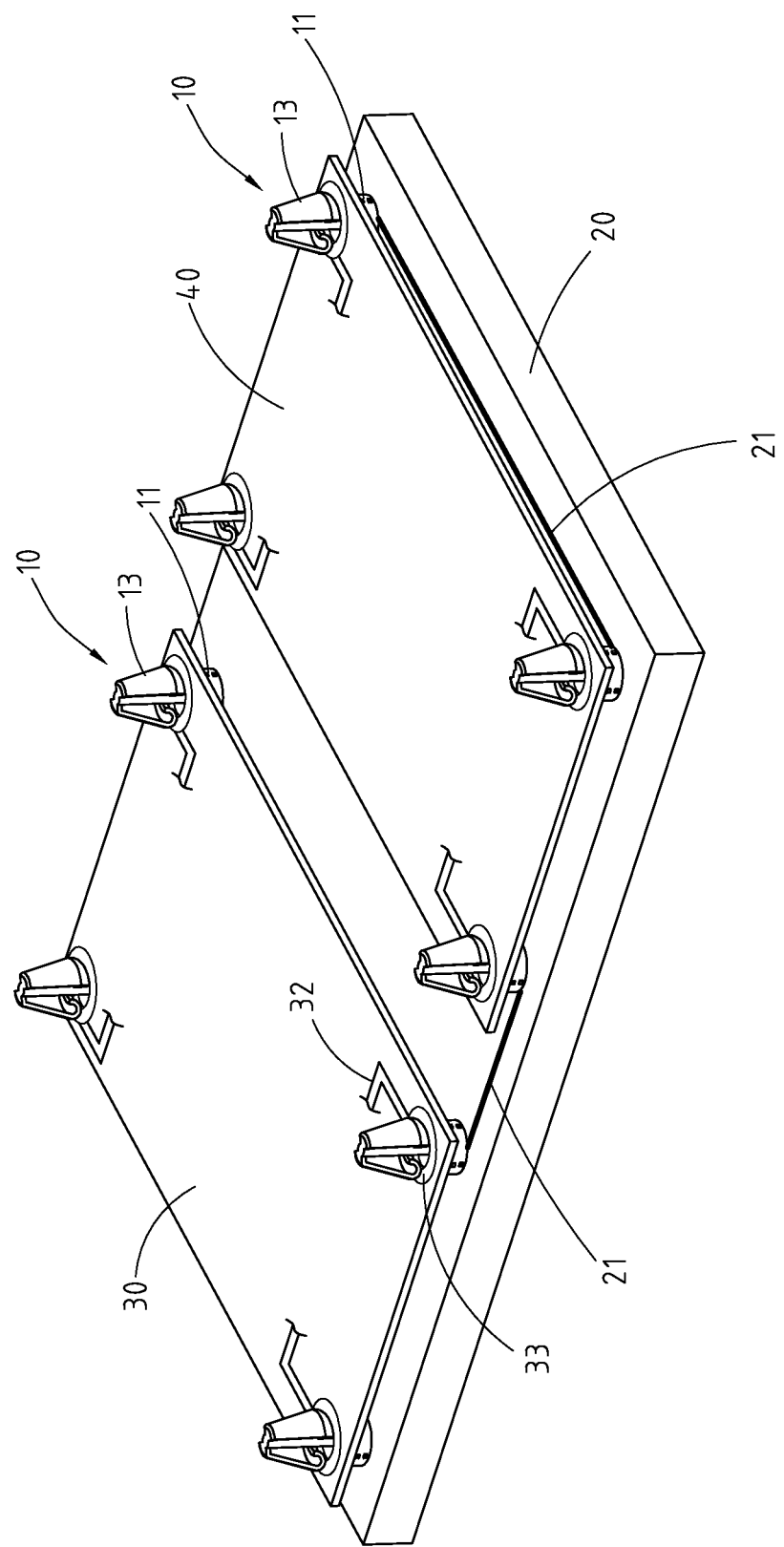
FIG. 4 is a schematic view for showing two circuit boards are assembled on the flexible positioning post of the first embodiment.

Please refer to FIG. 4, which is a schematic view for showing two circuit boards are assembled on the flexible positioning post of the first embodiment. Since it is made entirely from metal, in addition to being provided for fastening with the circuit board 30, the flexible positioning post 10 is also provided for the electrical connection. For electrically connecting one circuit board 30 with another circuit board 40, in addition to using welding methods or applying soft circuit board, another method is using the flexible positioning post 10. As shown in FIG. 4, each of the assembling holes 31 of the circuit board 30 has a copper plate 33 disposed around the periphery thereof, and a plurality of circuits 32 of the circuit board 30 is directed to any of the copper plates 33. After the circuit board 30 is engaged with the flexible positioning post 10, the bending portions 133 of the two metal elastic pieces 13 of the flexible positioning post 10 is abutted against the copper plate 33 thereby forming an electrical connection between the circuit board 30 and the flexible positioning post 10. Next, after the circuit 32 for electrically connecting with another circuit board 40 is directed to any of the copper plate 33 on the circuit board 30, since the bending portions 133 of the two metal elastic pieces 13 abutted against the circuit board 30 are electrically connected with the copper plate 33 of the circuit board 30, the electrical signal can be delivered from the copper plate 33 to the metal elastic pieces 13, the metal post 12, and the base 11. Thereafter, a copper foil circuit 21 is applied on the housing 20 for electrically connecting the two bases 11 of the two flexible positioning posts 10. As a result, the circuit board 30 is electrically connected with another circuit board 40 via the flexible positioning post 10 on the circuit board 30, the copper foil circuit 21 and the flexible positioning post 10 on another circuit board 40. In this embodiment, the copper plate 31, the circuit 32, and the copper foil circuit 21 are made of copper, but not limited thereto, in some implementation aspects, the components for delivering electrical signals can be made of aluminum, gold or other conductive materials.

Accordingly, two or more circuit boards can be electrically connected with each other without the application of soft circuit boards, flat cables or connectors. Furthermore, in addition to being provided for the electrical connection between the circuit boards, the copper foil circuit 21 can be directed to the ground wire, so that the circuit board 30 is grounding.

Figure 5:
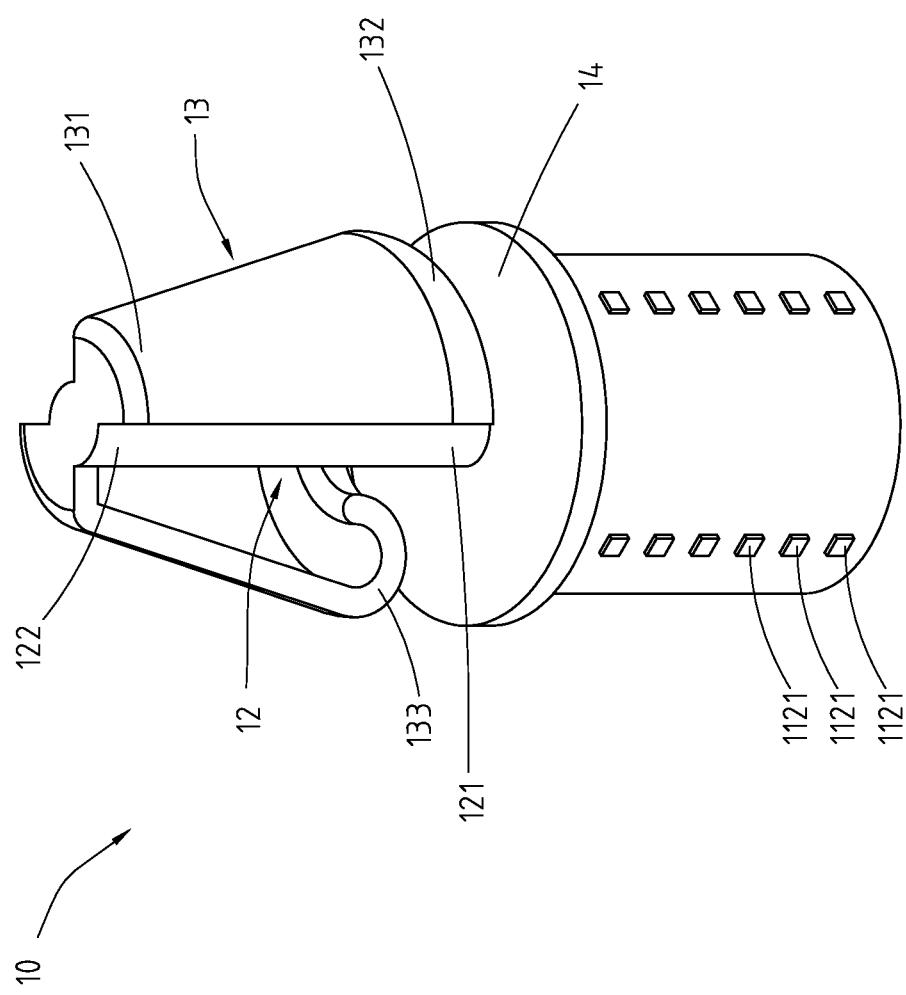
FIG. 5 is a perspective view of a flexible positioning post of a second embodiment of the disclosure.
Figure 6:
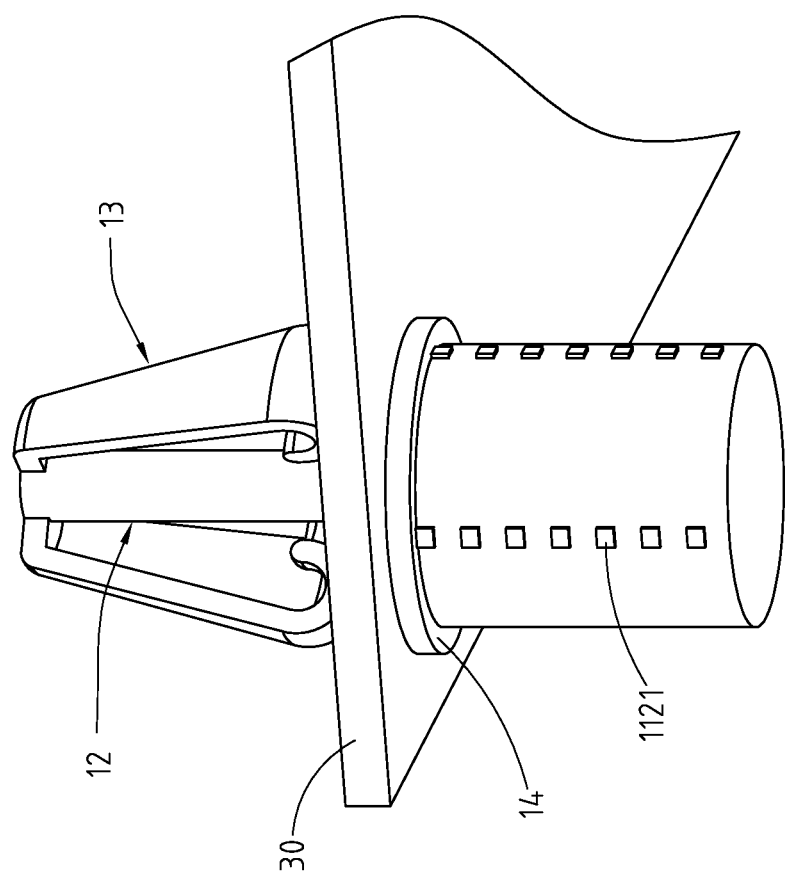
FIG. 6 is a schematic view for showing a circuit board is assembled on the flexible positioning post of the second embodiment.

Please refer to FIG. 5 and FIG. 6, which are respectively a perspective view of a flexible positioning post of a second embodiment and a schematic view for showing a circuit board is assembled on the flexible positioning post of the second embodiment. The structure of the second embodiment is approximately similar to that of the first embodiment, except that the flexible positioning post 10 includes a buffering member 14 in the second embodiment. The buffering member 14 sleeves onto the metal post 12 and is abutted against the upper surface 111 of the base 10. In this embodiment, the buffering member 14 is a buffering rubber, but embodiments of the disclosure are not limited thereto; in some implementation aspects, the buffering member 14 can be a member capable of being a buffer, for example, a spring.

As shown in FIG. 5, when the circuit board 30 is engaged with the flexible positioning post 10, the circuit board 30 is abuttingly sandwiched between the buffering member 14 and the bending portions 133 of the two metal elastic pieces 13. The buffering member 14 prevents the circuit board 30 from directly impacting to the upper surface 111 of the base 10 caused by a strong pressing force applied to the circuit board 30 upon the circuit board 30 is pressed downwardly to be engaged with the flexible positioning post 10. Moreover, the buffering member 14 can be provided for adjusting the space between the upper surface 111 of the base 10 and the bending portions 133 of the two metal elastic pieces 13 or for compensating the width tolerance of the circuit board 30. For assembling a thinner circuit board 30, the buffering member 14 is provided for compensating the rest space between the circuit board 30 and the bending portions 133 of the two metal elastic pieces 13, so that the circuit board 30 is securely abutted against the bending portions 133 of the two metal elastic pieces 13. Based on this, in addition to connecting the bending portions 133 of the metal elastic pieces 13 with the circuit board 30 securely, the buffering member 14 can also reduced the resonant noises caused by the bad abutment between the circuit board 30 and the bending portions 133 upon the circuit board 30 is engaged with the flexible positioning post 10.

Figure 7:
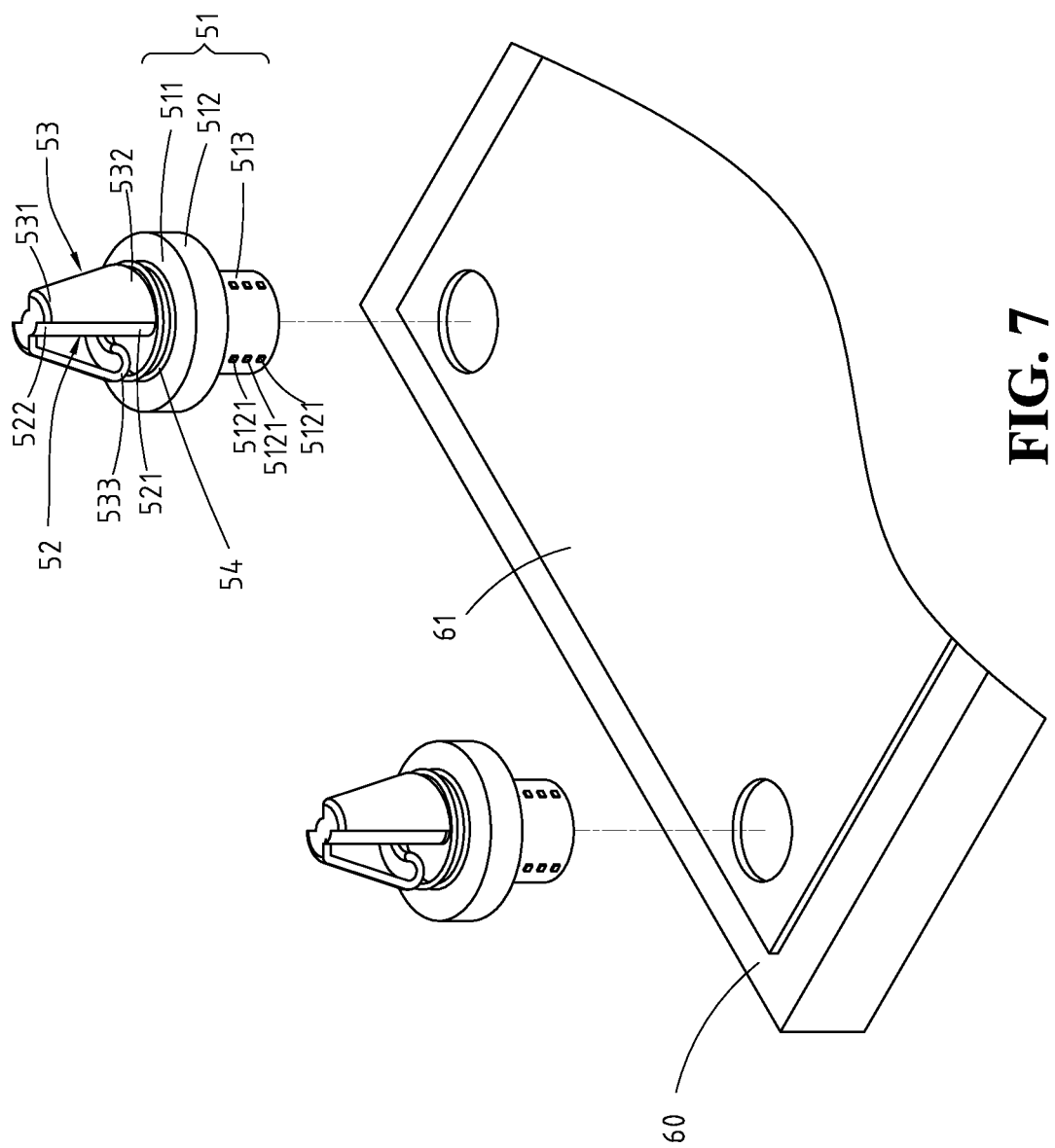
FIG. 7 is a perspective view of a flexible positioning post of a third embodiment of the disclosure and a housing.
Figure 8:
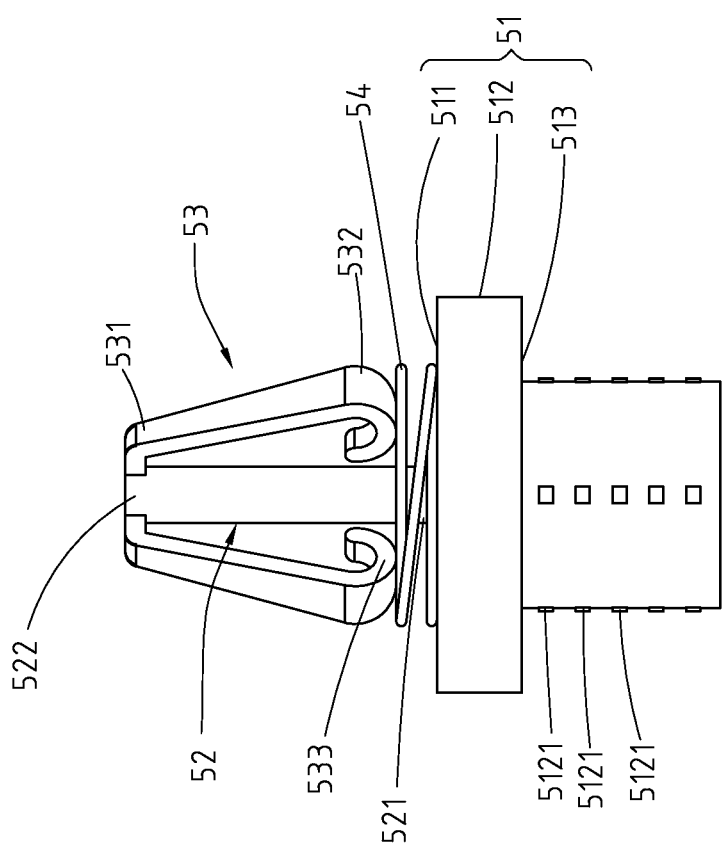
FIG. 8 is a lateral view of the flexible positioning post of the third embodiment of the disclosure.

Please refer to FIG. 7 and FIG. 8, which are respectively a perspective view of a flexible positioning post of a third embodiment and a housing, and a lateral view of the flexible positioning post of the third embodiment. The flexible positioning post 50 includes a base 51, a metal post 52, a buffering member 54 and two metal elastic pieces 53. The base 51 has an upper surface 511 and a lateral surface 512. One end of the lateral surface 512 distant from the upper surface 511 is recessed inwardly such that forming a shrunken portion 513. As shown in FIG. 7, because of the shrunken portion 513 formed at one end of the lateral surface 512 distant from the upper surface 511, the lateral view of the base 51 is T profiled. That is, a round cylinder with larger diameter is formed near the upper surface 511 of the base 51 and another round cylinder with smaller diameter is formed distant from the upper surface 511 of the base 51. The base 51 is round cylinder shaped in this embodiment, but embodiments of the disclosure are not limited thereto, in some implementation aspects, the base 51 is polygonal cylinder shaped.

The shrunken portion 513 has a plurality of protruding blocks 5121 disposed on the lateral surface 512 thereof. In this embodiment, the protruding blocks 5121 are disposed uniformly around the axis center of the lateral surface 512 of the shrunken portion 513 of the base 51; in some implementation aspects, a number of protruding blocks 5121 are disposed irregularly or in an interlaced manner on the lateral surface 512 of the shrunken portion 513. For embedding the base 51 into the housing 60 made of plastic, hot melting or ultrasonic welding methods are commonly applied. Here, the protruding blocks 5121 are provided as the skidproof structure of the housing 60, such that the flexible positioning post 50 does not detach from the housing 60 because of the force applied thereto upon assembling or disassembling.

As shown in FIG. 7, the housing 60 has a copper foil layer 61 disposed thereon. When the base 51 of the flexible positioning post 50 is embedded into the housing 60 made of plastic, only the shrunken portion 513 of the base 51 is embedded into the housing 60, and the portion with larger diameter close to the upper surface 511 is abutted against the copper foil layer 61. Based on this, the whole copper foil layer 61 is applied as the grounding face so as to expand the grounding area of the circuit board; but embodiments of the disclosure are not limited thereto, in some implementation aspects, alumina foil layer is applied as the grounding face.

Similar to the above embodiments, in this embodiment, the metal post 52 has a first end 521 and a second end 522 opposite to each other. The first end 521 is connected to the upper surface 511 of the base 51, and the two metal elastic pieces 53 are securely assembled on the second end 522. In this embodiment, the metal post 52 is a round post; but embodiments of the disclosure are not limited thereto, the metal post 52 can be a polygonal post in some embodiments. For the convenience of positioning during manufacturing and assembling, the metal post 52 is disposed at the axis center of the base 51. In some embodiments, the base 51 and the metal post 52 are formed integrally as a whole by, for example, molding or cutting molding, so that the base 51 and the metal post 52 are formed as an inseparable structure.

As shown in FIG. 7, the two metal elastic pieces 53 are disposed uniformly around an outer periphery of the metal post 52. In this embodiment, the two metal elastic pieces 53 are disposed opposite to each other. Each of the metal elastic pieces 53 has a fixed end 531 and a free end 532 opposite to each other. The fixed end 531 is securely assembled at the second end 522 of the metal post 52. The free end 532 is adjacent to the upper surface 511 of the base 51 and bent toward the metal post 52 such that forming a bending portion 533. Accordingly, because of the material properties of the metal elastic pieces 53 and the bending portion 533 formed on the free end 532, upon receiving a foreign force, the free end 532 of each of the metal elastic pieces 53 is moved toward the metal post 52; conversely, once the foreign force is removed, the free end 532 of each of the metal elastic pieces 53 is moved resiliently.

For the purpose of enhancing the resilient elasticity, the width of the free end 532 of each of the metal elastic pieces 53 is longer than the width of the fixed end 531 thereof. In a lateral view, the outline of the elastic metal piece 53 is formed as a trapezoid. Based on this, the bending portion 533 of the free end 532 is longer than the rest portion thereof and provides a stronger resilient elasticity.

The buffering member 54 sleeves onto the metal post 53 and is abutted against the upper surface 511 of the base 51. In this embodiment, the buffering member 54 is a spring. The assembling of the buffering member 54 prevents the circuit board from directly impacting to the upper surface 511 of the base 51 caused by a strong pressing force applied to the circuit board upon the circuit board is pressed downwardly to be engaged with the flexible positioning post 50. Moreover, the buffering member 54 can be provided for adjusting the space between the upper surface 511 of the base 51 and the bending portions 533 of the two metal elastic pieces 53 or for compensating the width tolerance of the circuit boards. For assembling a thinner circuit board, the buffering member 54 is provided for compensating the rest space between the circuit board and the bending portions 533 of the two metal elastic pieces 53, so that the circuit board is securely abutted against the bending portions 533 of the two metal elastic pieces 53. Based on this, in addition to connecting the bending portions 533 of the metal elastic pieces 53 with the circuit board securely, the buffering member 54 can also reduced the resonant noises caused by the bad abutment between the circuit board and the bending portions 533 upon the circuit board is engaged with the flexible positioning post 50.

Similar to the first embodiment, in this embodiment, when the circuit board is engaged with the flexible positioning post 50, the circuit board is pressed downwardly for being passed through by the two metal elastic pieces 53 of the flexible positioning post 50 thereby abutting against the buffering member 54; when the foreign force is removed, the bending portions 533 of the free ends 532 of the two metal elastic pieces 53 are abutted against the circuit board for positioning the circuit board. Based on this, no extra tools need be applied during assembling or disassembling the circuit board. Additionally, a multi-point positioning for the circuit board is achieved by a single downward press, thereby significantly reducing the time for assembling the circuit board in the housing 60.

While the disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A flexible positioning post, comprising:
    a base having an upper surface and a lateral surface connected to the upper surface, the lateral surface having a plurality of protruding blocks;
    a metal post having a first end and a second end opposite to each other, the first end connecting to the upper surface of the base; and
    a plurality of metal elastic pieces, each of the metal elastic pieces having a fixed end and a free end opposite to each other, the fixed end being securely assembled at the second end of the metal post, the free end being adjacent to the upper surface and bent toward the metal post to form a bending portion, whereby upon receiving a foreign force, each of the free ends of the metal elastic pieces is able to be moved toward the metal post, and each of the free ends of the metal elastic pieces is able to resiliently return to its rest position when the foreign force is removed.

2. The flexible positioning post according to claim 1, wherein the metal elastic pieces are disposed at regular intervals around an outer periphery of the metal post.

3. The flexible positioning post according to claim 2, wherein for each of the metal elastic pieces, a width of the free end thereof is longer than a width of the fixed end thereof.

4. The flexible positioning post according to claim 1, wherein the lateral surface of the base has a shrunken portion disposed at one end thereof distant from the upper surface, the protruding blocks are disposed at the shrunken portion.

5. The flexible positioning post according to claim 1, wherein the base is round cylinder shaped, and the metal post is disposed at an axis center of the base.

6. The flexible positioning post according to claim 1, wherein the base and the metal post are inseparable and formed integrally as a whole.

7. A flexible positioning post, comprising:
    a base having an upper surface;
    a metal post having a first end and a second end opposite to each other, the first end connecting to the upper surface of the base;
    a plurality of metal elastic pieces, each of the metal elastic pieces having a fixed end and a free end opposite to each other, the fixed end being securely assembled at the second end of the metal post, the free end being adjacent to the upper surface and bent toward the metal post to form a bending portion, whereby upon receiving a foreign force, each of the free ends of the metal elastic pieces is able to be moved toward the metal post, and each of the free ends of the metal elastic pieces is able to resiliently return to its rest position when the foreign force is removed; and a buffering member being sleeved on the metal post and abutting against the upper surface of the base.

8. The flexible positioning post according to claim 7, wherein the buffering member is a buffering rubber.

9. The flexible positioning post according to claim 7, wherein the buffering member is a spring.

10. A flexible positioning post, comprising:

a base having an upper surface and a lateral surface connected to the upper surface, one end of the lateral surface distant from the upper surface is recessed inwardly to have a relatively-smaller diameter;

a metal post having a first end and a second end opposite to each other, the first end connecting to the upper surface of the base; and a plurality of metal elastic pieces, each of the metal elastic pieces having a fixed end and a free end opposite to each other, the fixed end being securely assembled at the second end of the metal post, the free end being adjacent to the upper surface and bent toward the metal post to form a bending portion, whereby upon receiving a foreign force, each of the free ends of the metal elastic pieces is able to be moved toward the metal post, and each of the free ends of the metal elastic pieces is able to resiliently return to its rest position when the foreign force is removed.

* * * * *